(12) United States Patent
Wielandt et al.

(10) Patent No.: US 11,582,870 B2
(45) Date of Patent: Feb. 14, 2023

(54) BOARDS HAVING SOLDERLESS INTERCONNECTS

(71) Applicant: The Regents of the University of California, Oakland, CA (US)

(72) Inventors: Stijn Wielandt, Berkeley, CA (US); Baptiste Dafflon, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 17/543,032

(22) Filed: Dec. 6, 2021

(65) Prior Publication Data

US 2022/0192024 A1  Jun. 16, 2022

Related U.S. Application Data

(60) Provisional application No. 63/123,912, filed on Dec. 10, 2020.

(51) Int. Cl.
*H05K 1/18* (2006.01)
*H05K 1/11* (2006.01)

(52) U.S. Cl.
CPC .............. *H05K 1/181* (2013.01); *H05K 1/119* (2013.01); *H05K 2201/10151* (2013.01)

(58) Field of Classification Search
CPC ....................................................... H01R 9/09
USPC .......................................................... 361/760
See application file for complete search history.

(56) References Cited

U.S. PATENT DOCUMENTS

| | | | | |
|---|---|---|---|---|
| 5,219,292 | A * | 6/1993 | Dickirson | H01R 12/62 439/67 |
| 8,446,733 | B2 * | 5/2013 | Hampo | H01R 12/71 361/775 |
| 10,420,219 | B1 * | 9/2019 | Chen | H05K 1/181 |
| 2005/0219829 | A1 * | 10/2005 | Lee | H05K 3/306 174/262 |
| 2008/0264192 | A1 * | 10/2008 | Christensen | H05K 7/1409 74/469 |
| 2014/0199862 | A1 * | 7/2014 | Hirschy | H01R 12/585 439/84 |

* cited by examiner

*Primary Examiner* — Stanley Tso

(57) ABSTRACT

This disclosure provides systems, methods, and apparatus related to printed circuit boards. In one aspect, a device includes a first board and a second board. The first board includes at least two pins defined at an end of the first board. The first pin and the second pin are positioned along a first line and parallel to the first line. The second board includes at least two slots defined at an end of the second board. The first slot and the second slot are positioned along a second line and are angled from the second line by about ±10° to 15°. Each of the pins in the first board is engaged with each of the slots in the second board and forms an electrical connection between the first pin and the first slot and the second pin and the second slot.

20 Claims, 7 Drawing Sheets

BOARDS HAVING SOLDERLESS INTERCONNECTS

RELATED APPLICATIONS

This application claims priority to U.S. Provisional Patent Application No. 63/123,912, filed 10 Dec. 2020, which is herein incorporated by reference.

STATEMENT OF GOVERNMENT SUPPORT

This invention was made with government support under Contract No. DE-AC02-05CH11231 awarded by the U.S. Department of Energy. The government has certain rights in this invention.

TECHNICAL FIELD

This disclosure relates generally to printed circuit boards.

BACKGROUND

In agriculture, infrastructure monitoring, land management, and environmental research, sensor probes are used for soil or snow pack profiling. Some such sensor probes comprise a tube and sensors disposed in the tube. For example, the sensors can be positioned in the tube to measure soil parameters every about 5 centimeters (cm) to 10 cm at a depth of about 1 meter (m) to 2 m. Parameters including soil temperature, moisture, salinity, chemistry, porosity, and stability can be measured, providing important information for efficiency and resilience in agricultural activities. In the fields of infrastructure monitoring and land management, soil profile sensor probes can be used to assess snow pack properties, avalanche risk, road, levy, pylon, and building stability, and for the prediction of landslides.

Many different sensor probes, especially for agricultural applications, are commercially available. The available sensor probes are thick tubes (e.g., tubes having a large diameter) that are about 1 inches to 2 inches or more in diameter. The deployment of these sensor probes is time consuming and costly because boreholes are drilled in the ground in order to position the sensor probes. Drilling boreholes causes soil disturbance and in some cases inaccurate measurements.

The commercially available sensor probes include thick tubes because of the array of sensors in the tubes. Each sensor is placed on a printed circuit board (PCB) with connectors, and all the PCBs are wired together. Such sensor assemblies, including PCBs, wires, and connectors, are bulky. Such sensor assemblies are also labor intensive to assemble, increasing the cost of the sensor probes. For example, the cost for a commercial sensor probe may exceed $1000 for a 1-year lease. For these reasons, monitoring setups are usually limited to a few sensor probes even though higher measurement resolutions are usually desirable.

SUMMARY

Described herein is a technique for cascading PCBs. A specific implementation of cascading PCBs in thin sensor probes (e.g., having less than 10 millimeter cross-sections) for soil profiling is described. The sensor probes can be easily and quickly deployed. For example, a sensor probe can be pushed into the ground without drilling a borehole. Also, the assembly process for the sensor probe is less expensive and faster than current commercially available sensor probes. For example, the boards in a sensor probe can be assembled without using wires.

One innovative aspect of the subject matter described in this disclosure can be implemented in a device including a first board and a second board. The first board includes at least two pins defined at an end of the first board. The first pin and the second pin are positioned along a first line and parallel to the first line. The second board includes at least two slots defined at an end of the second board. The first slot and the second slot are positioned along a second line and are angled from the second line by about ±10° to 15°. The first slot has a positive or negative angle from the second line and the second slot has the other of the positive angle or the negative angle from the second line. Each of the pins in the first board is engaged with each of the slots in the second board and forms an electrical connection between the first pin and the first slot and the second pin and the second slot.

In some embodiments, the first board has a first sensor disposed thereon. In some embodiments, the first sensor comprises a temperature sensor, a tilt sensor, a capacitive sensor, or an optical sensor. In some embodiments, the second board has a second sensor disposed thereon. In some embodiments, the second sensor comprises a temperature sensor, a tilt sensor, a capacitive sensor, or an optical sensor. In some embodiments, the first board and the second board both comprise printed circuit boards (PCBs).

In some embodiments, the first slot and the second slot are positioned along a second line and are angled from the second line by about ±12°. In some embodiments, each of the pins has a metal disposed thereon. In some embodiments, each of the slots has a metal disposed on the interior surface of the slot. In some embodiments, each of the pins includes two barbs proximate an end of the pin.

In some embodiments, the first board and the second board are each about 5 centimeters to 50 centimeters long. In some embodiments, the first board and the second board are each about 0.8 millimeters thick.

In some embodiments, the device further comprises a memory device connected to the second board, a microprocessor connected to the second board, a power source connected to the second board, and a communication connector connected to the second board. In some embodiments, the communication connector comprises a wireless communication technology.

In some embodiments, the first board and the second board are disposed in a tube. In some embodiments, the tube has an inner diameter of about 5 millimeters to 25 millimeters and an outer diameter of about 7 millimeters to 30 millimeters. In some embodiments, a length of the tube is about 0.5 meters to 2 meters. In some embodiments, the tube comprises a metal or a plastic. In some embodiments, the tube is translucent or transparent. In some embodiments, the tube is opaque.

Another innovative aspect of the subject matter described in this disclosure can be implemented in a device including a first board and a second board. The first board includes at least two pins defined at an end of the first board. The first pin and the second pin are positioned along a first line and parallel to the first line. The second board includes at least two slots defined at an end of the second board. The first slot and the second slot are positioned along a second line and are angled from the second line by about ±10° to 15°. The first slot has a positive or negative angle from the second line and the second slot has the same positive angle or the same negative angle from the second line. Each of the pins in the first board is engaged with each of the slots in the second board and forms an electrical connection between the first pin and the first slot and the second pin and the second slot.

In some embodiments, the first board has a first sensor disposed thereon. In some embodiments, the first sensor comprises a temperature sensor, a tilt sensor, a capacitive sensor, or an optical sensor. In some embodiments, the second board has a second sensor disposed thereon. In some embodiments, the second sensor comprises a temperature sensor, a tilt sensor, a capacitive sensor, or an optical sensor. In some embodiments, the first board and the second board are disposed in a tube. In some embodiments, the first board and the second board both comprise printed circuit boards (PCBs). In some embodiments, the first slot and the second slot are positioned along a second line and are angled from the second line by about ±12°. In some embodiments, each of the pins includes two barbs proximate an end of the pin.

Details of one or more embodiments of the subject matter described in this specification are set forth in the accompanying drawings and the description below. Other features, aspects, and advantages will become apparent from the description, the drawings, and the claims. Note that the relative dimensions of the following figures may not be drawn to scale.

DETAILED DESCRIPTION

Figure 1:
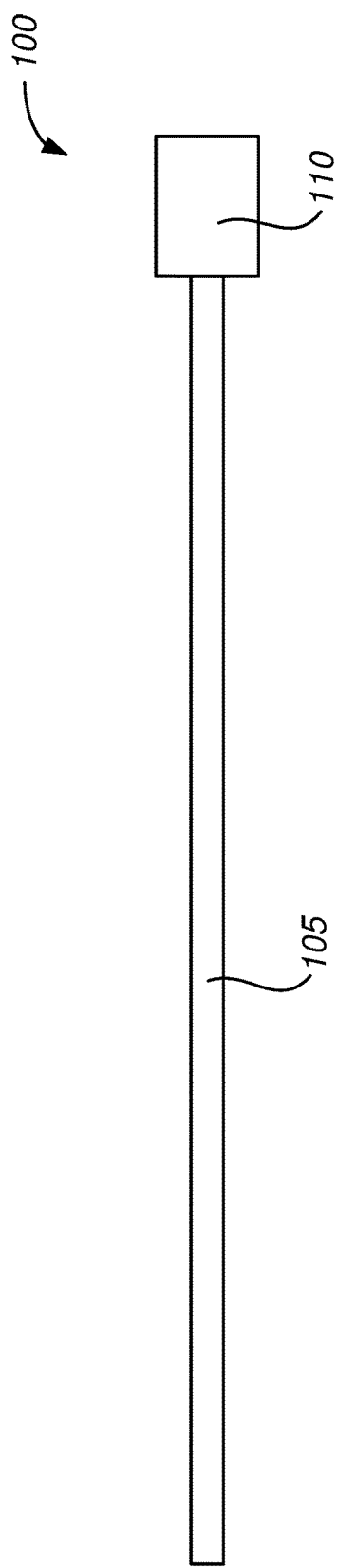
FIG. 1 shows an example of a schematic illustration of a sensor probe.

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise. For example, a system uses a processor in a variety of contexts. However, it will be appreciated that a system can use multiple processors while remaining within the scope of the present invention unless otherwise noted.

The terms "about" or "approximate" and the like are synonymous and are used to indicate that the value modified by the term has an understood range associated with it, where the range can be ±20%, ±15%, ±10%, ±5%, or ±1%. The terms "substantially" and the like are used to indicate that a value is close to a targeted value, where close can mean, for example, the value is within 80% of the targeted value, within 85% of the targeted value, within 90% of the targeted value, within 95% of the targeted value, or within 99% of the targeted value.

Processes for manufacturing sensor assemblies for soil profiling are challenging to perform. Sensor assemblies for environmental research are often longer than 50 cm and may use a semi-rigid structure to ensure consistent spacing between sensors. Commercial manufacturing services for printed circuit boards (PCBs) often have size constraints that make it impossible to build a PCB of a desired size.

In order to overcome these issues, multiple boards can be cascaded. In this case, the boards are electrically connected to one another. Common methods to connect boards include connector-cable-connector setups, direct PCB-to-PCB soldering, and board-to-board solder mounted connectors (e.g., surface mount or through hole soldering). However, all of these techniques have drawbacks:

Connector-cable-connector setups. This is an expensive and bulky technique. Connector-cable-connector setups are commonly used in commercial soil profile sensors. Each board has an incoming and outgoing connector soldered onto it, and all boards are connected together with cable assemblies. The cost of these connections (e.g., connector pieces, wires, soldering, and manual assembly) may exceed the cost of the sensors.

Direct PCB-to-PCB soldering. This is a labor intensive technique. It is mechanically unreliable due to solder joint cracking due to mechanical stresses. Direct PCB-to-PCB soldering also uses a lot of space on the PCB.

Board-to-board solder mounted connectors. These parts are expensive (e.g., several dollars per connector), are unreliable under mechanical stress, and require too much space on a PCB. Sensor assemblies that are assembled using board-to-board solder mounted connectors also are difficult to fit into thin tubes.

Disclosed herein is a new board-to-board connection technique. The technique does not require any additional components and does not require soldering. The technique uses two complementary PCB designs which can be classified as a female (slots) and male (pins) design. The pins can interlock with the slots and form electrical connections between two boards. The configuration of the pins and the slots helps to ensure that metallized areas of each PCB are pressing against each other, creating a reliable electric contact. An example of the new board-to-board connection technique implemented in sensor probes is described below.

FIG. 1 shows an example of a schematic illustration of a sensor probe. The sensor probe 100 includes a tube 105 and an end housing 110. The tube 105 houses a sensor assembly, described below. The sensor assembly includes sensors for measuring properties of interest of the medium (e.g., soil, snow) in which the sensor probe is inserted.

In some embodiments, the tube 105 comprises a cylinder. In some embodiments the tube 105 has an inner diameter of about 5 millimeters (mm) to 25 mm. In some embodiments, the tube has an outer diameter of about 7 mm to 30 mm. In some embodiments, the tube has an about 5 mm inner diameter and an about 10 mm outer diameter.

In some embodiments, the tube has a length of about 0.5 meters (m) to 2 m, or about 1 m. In some embodiments, longer tubes are used for sensor probes that are used to measure soil deformation. With a longer tube, sensors can be positioned at a depth in the ground where measurement conditions are stable.

Figure 2:
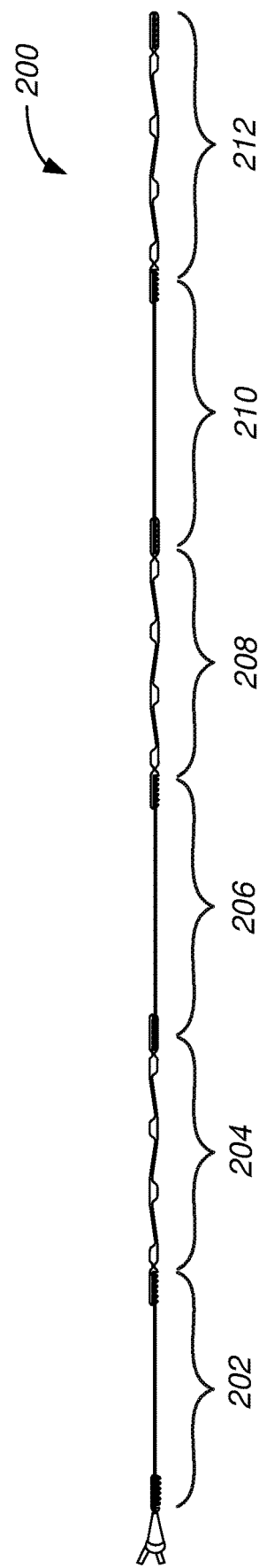
FIG. 2 shows an example of a schematic illustration of a sensor assembly.

FIG. 2 shows an example of a schematic illustration of a sensor assembly. The sensor assembly 200 comprises a plurality of boards 202, 204, 206, 208, 210, and 212. In some embodiments, the sensor assembly 200 comprises 2 to 10 boards. In some embodiments, the sensor assembly 200 comprises 2 boards. In some embodiments, the assembly comprises 10 boards. In some embodiments, a board includes at least one sensor. In some embodiments, a board does not include a sensor. A board is described further below.

Returning to FIG. 1, in some embodiments, a memory device (not shown), a microprocessor (not shown), a power source (not shown), and a communication connector (not shown) are disposed inside the end housing 110 of the sensor probe 100. In some embodiments, the memory device, the microprocessor, the power source, and the communication connector are connected to the sensor assembly disposed in the tube 105. The power source provides power to the sensor assembly, the memory device, the microprocessor, and the communication connector. In some embodiments, the power source comprises a battery. The microprocessor receives measurements from the sensors on the boards of the sensor assembly. The memory device records and stores the measurements. In some embodiments, the memory device comprises solid state memory. The communication connector provides a way in which a researcher can transfer the measurements from the memory device to another computer or computing system. In some embodiments, the communication connector is a wired port (e.g., a USB port) to which a researcher can connect a computer. In some embodiments, the communication connector is a wireless communication technology (e.g., Bluetooth). For example, with a Bluetooth connection, a research could transfer data from the memory device to a cell phone when the researcher is near the sensor probe.

In some embodiments, the sensor probe 100 does not include an end housing 110. For example, when the memory device, the microprocessor, the power source, and the communication connector are small enough, these components can be housed in the tube 105.

In some embodiments, the tube 105 comprises a metal or a plastic. In some embodiments, the plastic is UV resistant. In some embodiments, the plastic comprises cellulose acetate butyrate. In some embodiments, the tube 105 is opaque. In some embodiments, the tube 105 is translucent or transparent. For example, a translucent or transparent tube is used when a sensor on a board is an optical sensor. One instance in which a translucent or transparent tube may be used is when an optical sensor is used to measure snow density or other variable of the snow.

Figure 3A:
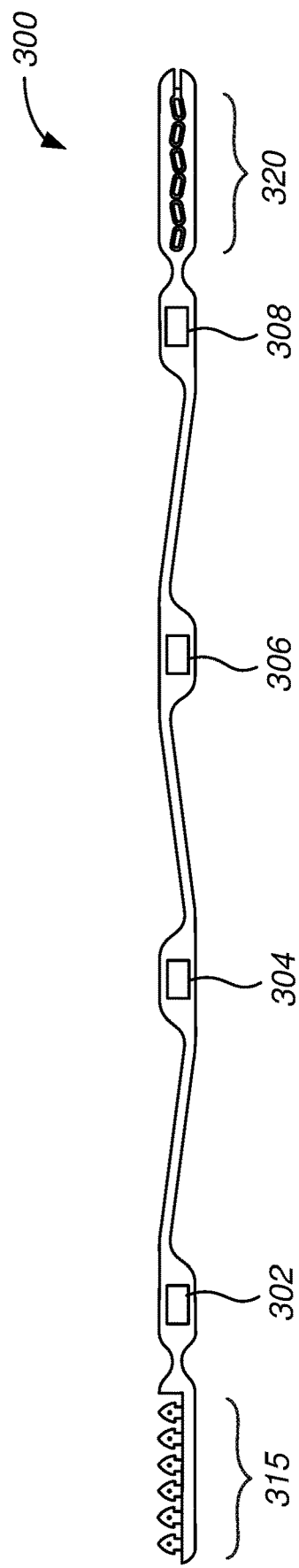
FIGS. 3A and 3B show examples of schematic illustrations of a board.
Figure 3B:
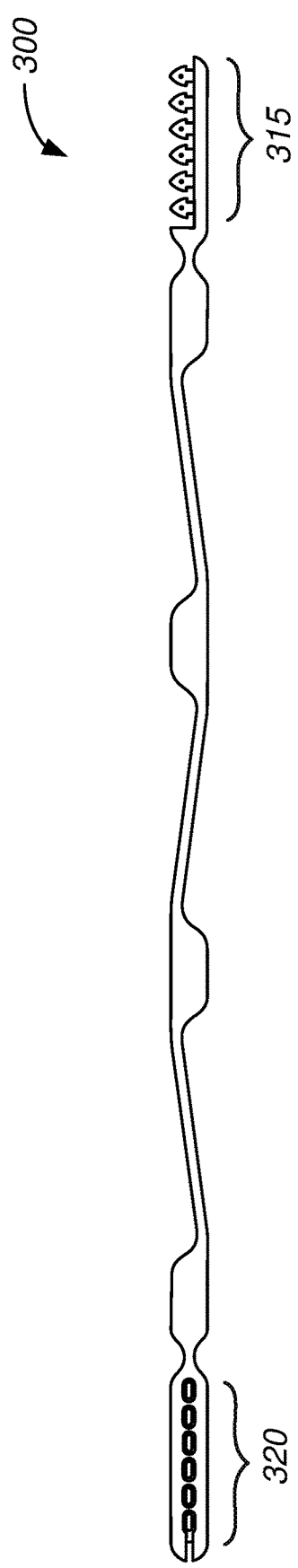

FIGS. 3A and 3B show examples of schematic illustrations of a board. FIG. 3A shows a schematic illustration of a first side of the board 300. FIG. 3B shows a schematic illustration of a second side of the board 300. In some embodiments, the board 300 comprises printed circuit board (PCB). A PCB comprises a non-conductive substrate (e.g., glass fiber reinforced resin, such as standard FR4) and conductive traces. In some embodiments, the board 300 comprises a single sheet of glass fiber reinforced resin with conductive traces (not shown) on both sides (i.e., a double-sided PCB). The conductive traces electrically connect sensors on the board to other boards and to the memory device, the microprocessor, the power source, and the communication connector of the sensor probe 100.

As shown in FIG. 3A, the board 300 includes four sensors 302, 304, 306, and 308. Such a board 300 may be referred to as a sensor board. In some embodiments, a board includes 1 to 10 sensors, 2 to 4 sensors, 4 sensors, or 2 sensors. In some embodiments, a sensor comprises a temperature sensor, a tilt sensor, a capacitive sensor, or an optical sensor. In some embodiments, a temperature sensor comprises a thermocouple or a resistance temperature detector (RTD).

A tilt sensor is a sensor that is used for measuring the tilt in multiple axes of a reference plane. Tilt sensors measure a tilting position with reference to gravity. Tilt sensors can be used to measure soil stability. For example, if the soil shifts and deforms the sensor probe (e.g., deforms the sensor probe by micrometers), this displacement can be measured.

A capacitive sensor generates an electromagnetic (EM) field and measures the changes in the EM field to sense the environment surrounding the sensor. For example, a capacitive sensor can be used to determine the water content of the soil or the amount of salt in the water in the soil surrounding a sensor probe.

An optical sensor can be used when the tube 105 is transparent or translucent. For example, an optical sensor could be used to directly measure the optical characteristics of the surrounding medium (e.g., optically detecting white snow). As another example, a material could be placed on the outside of the tube that changes color or emits light depending on the chemical environment. An optical sensor could be used to detect this change in color or light emission.

In some embodiments, a board does not include any sensors. A board not having any sensors may be used so that a board with sensors could be positioned at a specified point within the tube. In some embodiments, a board not having any sensors has pins and slots so that the board can be connected (both physically and electrically) to other boards.

One end of the board 300 defines pins 315 and the other end of the board 300 defines slots 320. The pins 315 and the slots 320 are used to connect a first board to a second board. The board 300 defines 6 pins and 6 slots. In some embodiments, a board defines 2 to 10 pins and 2 to 10 slots. In some embodiments, a board defines 6 pins and 6 slots. In some embodiments, a board defines 2 pins and 2 slots.

In some embodiments, a board is about 5 centimeters (cm) to 50 cm long, about 10 cm to 50 cm long, or about 25 cm long. In some embodiments, a board is about 0.8 mm thick. In some embodiments, a board is about 1.6 mm thick.

Figure 4:
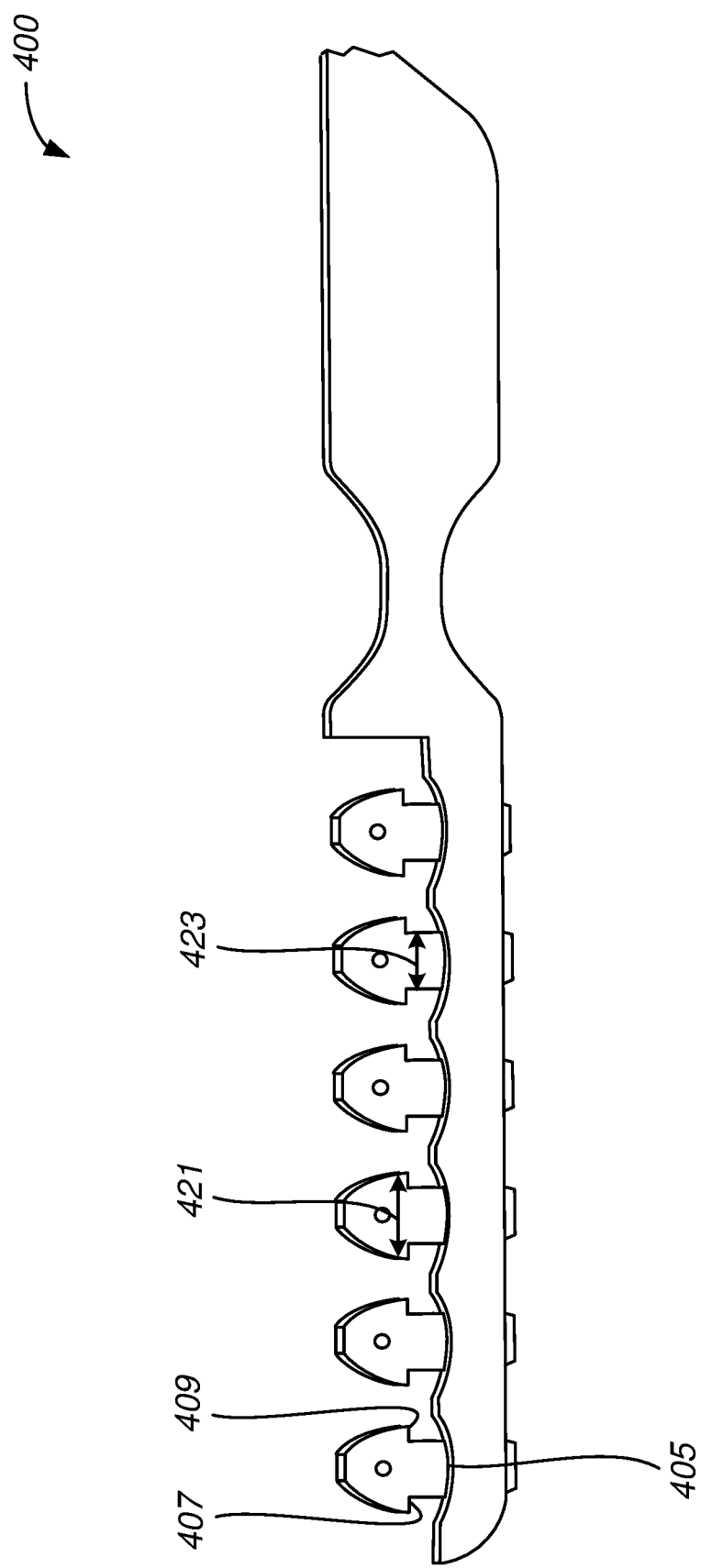
FIG. 4 shows an example of a schematic illustration of the pins defined by a board.

FIG. 4 shows an example of a schematic illustration of the pins defined by a board. In some embodiments, each of the pins has a metal disposed thereon. This is referred to in the PCB field as top and bottom metallization. In some embodiments, the metal comprises copper or gold. From a perspective of viewing the board along its thickness (e.g., 0.8 mm thick or 1.6 mm thick), the pins are aligned along a line and parallel to the line. Each of the pins defines 2 barbs proximate an end of the pin. For example, pin 405 defines a barb 407 and a barb 409.

Figure 5A:
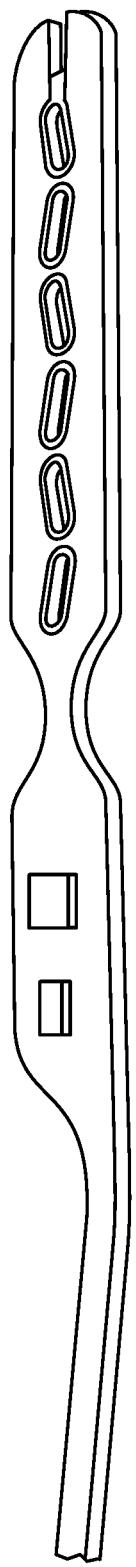
FIGS. 5A and 5B show examples of schematic illustrations the slots defined in a board.
Figure 5B:
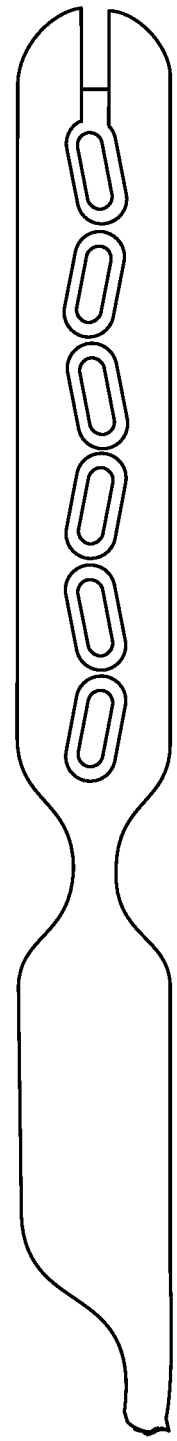
Figure 6:
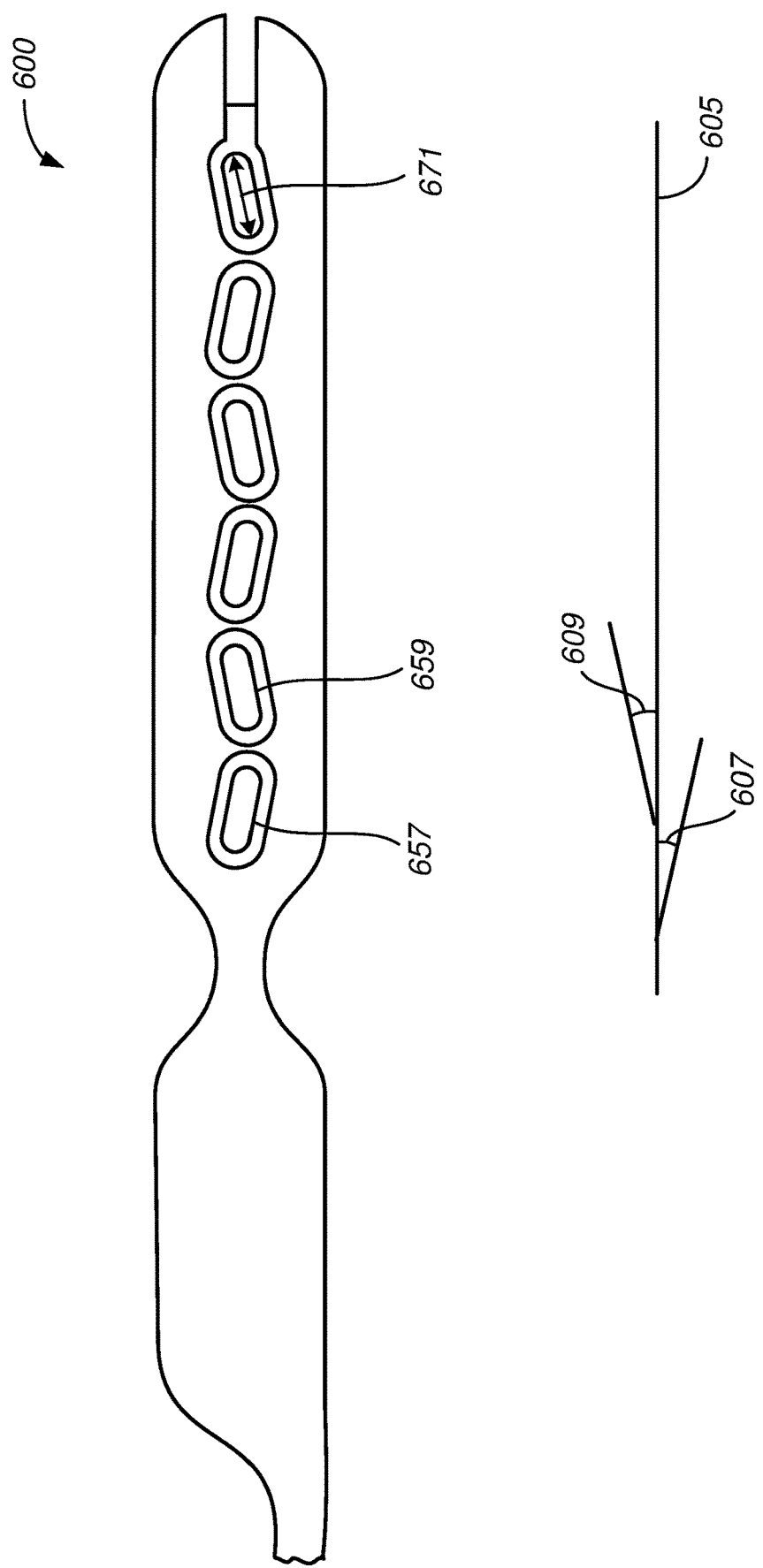
FIG. 6 shows an example of a schematic illustration of the offset angles of slots defined in a board.

FIGS. 5A and 5B show examples of schematic illustrations of the slots defined in a board. FIG. 6 shows an example of a schematic illustration of the offset angles of slots of a board. In some embodiments, each of the slots has a metal disposed on the interior surface of the slot. In some embodiments, the metal comprises copper or gold. As shown in FIG. 6, the slots are positioned along a line 605. Each of the slots is angled from the line by about ±10° to 15°, or by about ±120. For example, slot 657 is angled at a negative (−) angle 607 from the line 605. Slot 659 is angled at a positive (+) angle 609 from the line 605.

Different combinations of the positive and negative angles of the slots are possible. In some embodiments (e.g., such as the embodiment shown in FIG. 6), the positive and negative angles alternate between adjacent slots. In some embodiments, all of the angles of the slots are positive. In some embodiments, all of the angles of the slots are negative. In some embodiments, two slots are angled from the line by a positive angle, the next two adjacent slots are angled from the line by a negative angle, and the next two adjacent slots are angled from the line by a positive angle. Other combinations of positive and negative angles from the line are possible.

When two boards are connected to each other, each of the pins of a first board is engaged with each of the slots of a second board. An electrical connection is formed between the first pin and the first slot, the second pin and the second slot, and so on.

Figure 7A:
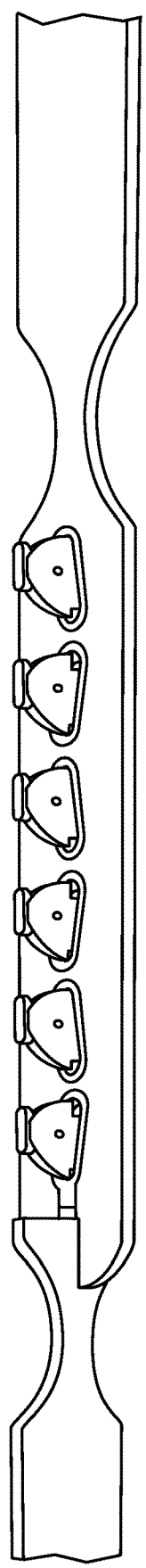
FIGS. 7A and 7B show examples of schematic illustrations of pins of a first board engaged with slots of a second board.
Figure 7B:
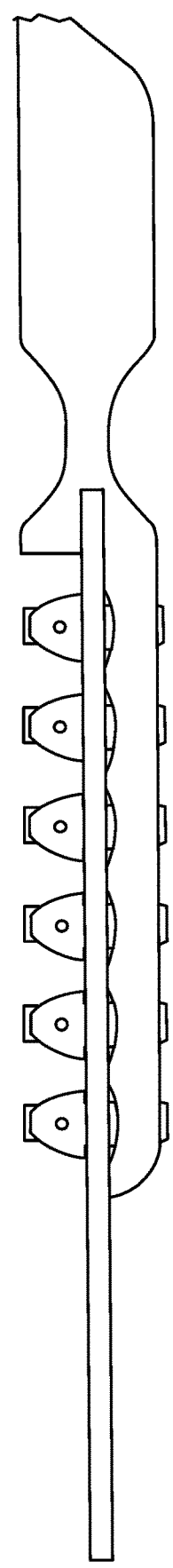

When connecting two boards to each other, the pins of the first board are pressed into the slots of the second board. When the pins of the first board are pressed into the slots of the second board, the pins start to twist due to the angles of the slots. When fully assembled (i.e., the first board is connected to the second board), the barbs of the pins are not in the slots but instead pushed all the way through a slot. FIGS. 7A and 7B show examples of schematic illustrations of pins of a first board engaged with slots of a second board.

In some embodiments, pins are slightly smaller than slots (i.e., the thickness of a pin is slightly less than the width of a slot). In some embodiments, pins are about 0.8 mm thick and slots are about 0.9 mm wide for an about 0.8 mm thick board. In some embodiments, pins are about 2.8 mm wide at the widest portion of the barbs (421 in FIG. 4) for an about 0.8 mm thick board. In some embodiments, pins are about 1.8 mm wide prior to the barbs (423 in FIG. 4) for an about 0.8 mm thick board. In some embodiments, slots are about 3.0 mm long (671 in FIG. 6) for an about 0.8 mm thick board. For a thicker board, the widths of the pins and the lengths of the slots would be greater.

In some embodiments, due to the pins being slight smaller than slots (i.e., a thickness of a pin being slightly smaller than a width of a slot), after the barbs of pins on a first board are pushed through the slots of a second board, the pins twist in an opposite direction of a twist on the pins produced by the slots. The barbs of the pins help to prevent the first board from separating from the second board. This engagement of a first board with a second board can be seen in FIG. 7A. The twisting back of a pin when the barbs of a pin are pushed through a slot also aids in ensuring electrical contact between the pin and the slot.

In some embodiments, a board will expand and contract with changes in temperature. To help to accommodate such expansion and contraction without putting a force on the connector pins and slots of a sensor assembly, a layout of the board 300 as shown in FIGS. 3A and 3B is used. The sections of the board that interconnect the sensors 302, 304, 306, and 308 are positioned under varying angles, forming a zig-zag type pattern of the board 300.

To make manufacturing of boards less expensive, in some embodiments each board of a sensor assembly has the same configuration and includes slots at one end and pins at the other end. The pins or slots at one end of a sensor assembly would not be used and could be cut off. In some embodiments, a wiring harness is used to provide electrical connections (e.g., to the memory device, the microprocessor, the power source, and the communication connector) to the other end of a sensor assembly.

Figure 8:
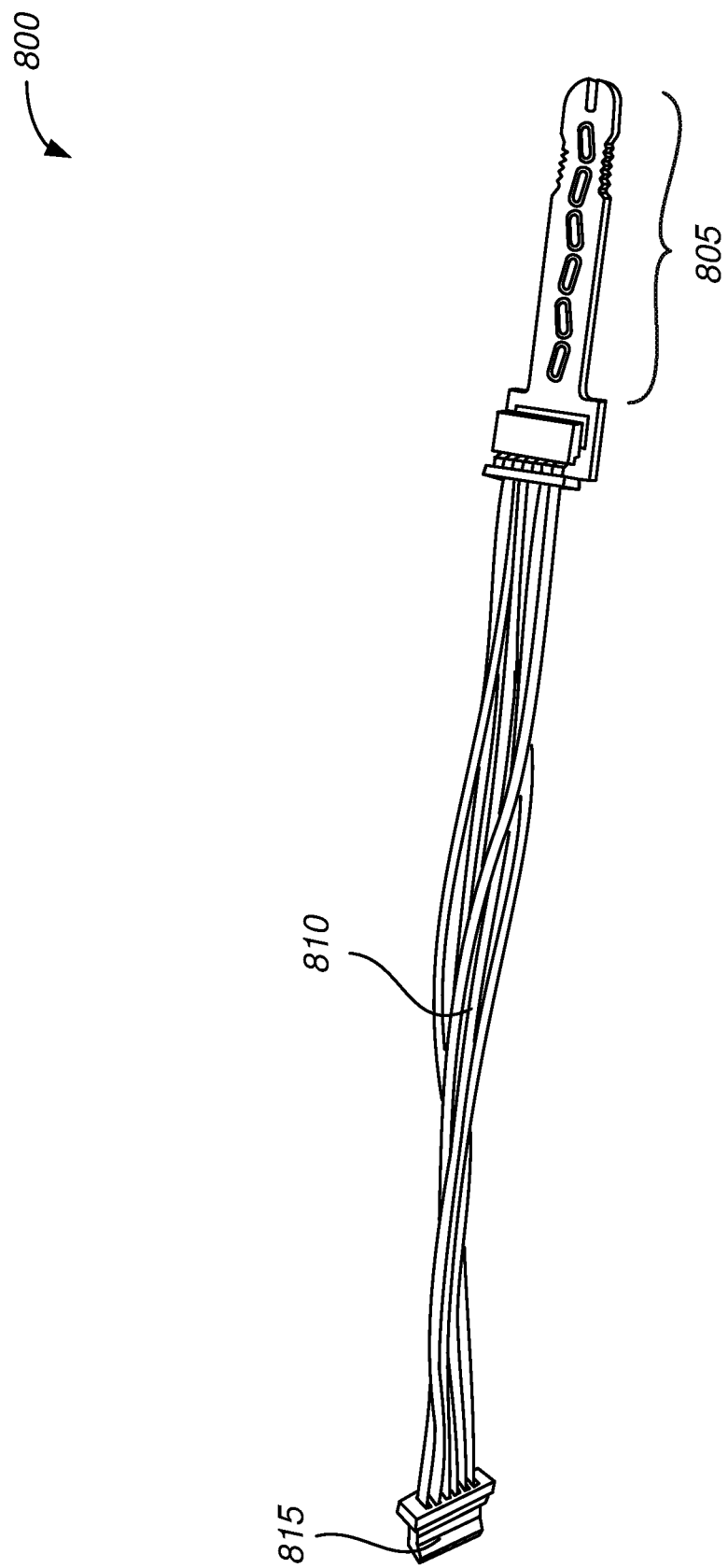
FIG. 8 shows an example of a schematic illustration of a wiring harness.

FIG. 8 shows an example of a schematic illustration of a wiring harness. The wiring harness 800 includes a small piece of a board 805 defining slots. In some embodiments, a wiring harness includes a small piece of a board defining pins. The slots or pins of a wiring harness are connected to wires 810 which may then be connected to a connector 815.

Turning back to FIG. 2, the pins and slots defined on the boards, along with the conductive traces on the boards, allow for electrical connections along the entire length of the sensor assembly. For example, the board 212 (and any sensors disposed thereon) is electrically connected to the board 210. The same with the board 210 and the board 208, and so on. These electrical connections allow for electrical connection of the board 202 with the board 212. A wiring harness connected for the board 202 may be connected to a memory device, a microprocessor, a power source, and a communication connector, allowing for electrical communication with a sensor on the board 212 and any other sensors disposed on any of the other boards. In some embodiments, the sensors on one board are electrically connected to sensors on another board. In some embodiments, the sensors on the boards are electrically connected a wiring harness or other electrical connector at an end board (in this instance, the board 202).

In the embodiments of the soil sensor described above, each pin/slot connection provide one electrical connection. In some embodiments, each pin/slot connection provides two electrical connections. For example, the first side and the second side of a pin are each coated with a metal, with the first side not being in electrical contact with the second side. Similarly, a first side and a second side of the interior surface of a slot also are each coated with a metal, with the first side not being in electrical contact with the second side. The first side of the pin and the first side of the slot provide one electrical connection, and the second side of the pin and the second side of the slot provide a second electrical connection.

Advantages of the embodiments described herein include:
Low production cost—the manufacturing of the pins and the slots uses standard PCB manufacturing techniques.
The locking design allows for mechanical robustness.
No components need to be soldered to join two PCBs.
The size of a PCB is not determined by a connector component. This allows for narrow PCB connection designs.
Since the connection of two PCBs is solderless, the connection is not sensitive to solder cracking. This makes the connection vibration resistant.
The relatively large contact surface between a pin and a slot yields a low contact resistance, allowing the connection to be used for high-current applications.
Increasing the pin separation would allow for high-voltage applications.
The design allows for perpendicular PCB stackups.
A thinner soil probe allows a probe to be inserted into the ground with minimal disturbance of the soil, allowing for more accurate sensor readings.

Embodiments described herein can be used to measure soil stability. For example, the sensor probes can be used to monitor the stability of levees, dams, roads, bridges, and other infrastructure. The sensor probes can also be used to measure the stability of snowpack (e.g., for avalanche management).

The pin/slot configuration of connecting two or more PCBs can be used in many other applications, including other narrow sensor arrays, LED strips, and battery pack assemblies, for example.

The following examples are intended to be examples of the embodiments disclosed herein, and are not intended to be limiting.

EXAMPLE

One PCB board design was used for sensor probes that are to be part of a soil/snow temperature profiling system. Each sensor probe cost about $60 per probe. 0.8 mm thick FR4 printed circuit board was used for the boards. The slots were angled 120 from a straight line. The slots were 0.9 mm wide and 3.0 mm long, and plated with gold. The pins were 2.8 mm wide and plated with gold.

The boards were about 5 mm wide. A sensor assembly of the boards fit in a tube having a 5.5 mm inner diameter and a 9.5 mm outer diameter. After the sensor assembly was positioned in the tube, the tube was filled with epoxy. The presence of epoxy in or on the PCB contacts (i.e., the PCB pins and slots) did not affect the reliability of the sensor assembly.

CONCLUSION

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

What is claimed is:

1. A device comprising:
   a first board, the first board including at least two pins defined at an end of the first board, the first pin and the second pin being positioned along a first line and parallel to the first line; and
   a second board, the second board including at least two slots defined at an end of the second board, the first slot and the second slot being positioned along a second line and being angled from the second line by ±10° to 15°, the first slot having a positive or negative angle from the second line, the second slot having the other of the positive angle or the negative angle from the second line, each of the pins in the first board engaged with each of the slots in the second board and forming an electrical connection between the first pin and the first slot and the second pin and the second slot.

2. The device of claim 1, wherein the first board has a first sensor disposed thereon.

3. The device of claim 2, wherein the first sensor comprises a temperature sensor, a tilt sensor, a capacitive sensor, or an optical sensor.

4. The device of claim 1, wherein the first board and the second board both comprise printed circuit boards (PCBs).

5. The device of claim 1, wherein the first slot and the second slot are positioned along a second line and are angled from the second line by ±12°.

6. The device of claim 1, wherein each of the pins has a metal disposed thereon.

7. The device of claim 1, wherein each of the slots has a metal disposed on an interior surface of the slot.

8. The device of claim 1, wherein each of the pins includes two barbs proximate an end of the pin.

9. The device of claim 1, wherein the first board and the second board are each 5 centimeters to 50 centimeters long.

10. The device of claim 1, wherein the first board and the second board are each 0.8 millimeters thick.

11. The device of claim 1, wherein the first board has a first sensor disposed thereon, the device further comprising:
    a memory device connected to the second board;
    a microprocessor connected to the second board;
    a power source connected to the second board; and
    a communication connector connected to the second board.

12. The device of claim 11, wherein the communication connector comprises a wireless communication technology.

13. The device of claim 1, wherein the first board and the second board are disposed in a tube.

14. The device of claim 13, wherein the tube has an inner diameter of 5 millimeters to 25 millimeters and an outer diameter of 7 millimeters to 30 millimeters.

15. The device of claim 13, wherein a length of the tube is 0.5 meters to 2 meters.

16. The device of claim 13, wherein the tube comprises a metal or a plastic.

17. The device of claim 13, wherein the tube is translucent or transparent.

18. The device of claim 13, wherein the tube is opaque.

19. A device comprising:
    a first board, the first board including at least two pins defined at an end of the first board, the first pin and the second pin being positioned along a first line and parallel to the first line; and
    a second board, the second board including at least two slots defined at an end of the second board, the first slot and the second slot being positioned along a second line and being angled from the second line by ±10° to 15°, the first slot having a positive or negative angle from the second line, the second slot having the same positive angle or the same negative angle from the second line, each of the pins in the first board engaged with each of the slots in the second board and forming an electrical connection between the first pin and the first slot and the second pin and the second slot.

20. The device of claim 1, wherein the first board and the second board both comprise printed circuit boards (PCBs).

* * * * *